(12) United States Patent
Channegowda et al.

(10) Patent No.: US 11,874,318 B2
(45) Date of Patent: Jan. 16, 2024

(54) ONLINE HEALTH MONITORING AND FAULT DETECTION FOR HIGH VOLTAGE DC DISTRIBUTION NETWORKS

(71) Applicant: Hamilton Sundstrand Corporation, Charlotte, NC (US)

(72) Inventors: Parikshith Channegowda, Glastonbury, CT (US); Gurkan Gok, Milford, CT (US); Suman Dwari, Vernon, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/459,282

(22) Filed: Aug. 27, 2021

(65) Prior Publication Data
US 2023/0062548 A1 Mar. 2, 2023

(51) Int. Cl.
*G01R 31/08* (2020.01)
*G01R 31/00* (2006.01)

(52) U.S. Cl.
CPC ......... *G01R 31/088* (2013.01); *G01R 31/008* (2013.01)

(58) Field of Classification Search
CPC ..... G01R 31/088; G01R 31/008; G01R 31/58
See application file for complete search history.

(56) References Cited

U.S. PATENT DOCUMENTS

| | | | |
|---|---|---|---|
| 4,686,641 A * | 8/1987 | Evans | H04B 3/54 379/22.03 |
| 5,448,176 A | 9/1995 | Mashikian et al. | |
| 6,292,911 B1 * | 9/2001 | Swanson | G06F 11/221 714/E11.035 |

(Continued)

FOREIGN PATENT DOCUMENTS

| | | | | |
|---|---|---|---|---|
| CN | 102246050 A | * | 11/2011 | .......... G01R 31/024 |
| CN | 108663202 A | * | 10/2018 | .......... G01M 13/00 |

(Continued)

OTHER PUBLICATIONS

Claiborne, Matt "How Airplanes Generate Electricity" downloaded from aerocorner.com (Year: 2023).*

(Continued)

*Primary Examiner* — Natalie Huls
(74) *Attorney, Agent, or Firm* — CANTOR COLBURN LLP

(57) ABSTRACT

Systems and methods for health monitoring and fault detection in power distribution networks are provided. Aspects include providing a first power supply coupled to a power channel, providing a load coupled to the power channel, providing a transmitting sensor coupled to the power channel between the first power supply and the load, providing a receiving sensor coupled to the power channel between the transmitting sensor and the load, operating the transmitting sensor to provide an AC test signal to the power channel, the AC test signal comprises a predefined test signal pattern, operating the receiving sensor to sense, from the power channel, a continuous power signal including the AC test signal, analyzing, by the controller, the AC test signal to determine a fault of the power channel based on comparing the predefined test signal pattern with a predefined nominal probe signal pattern corresponding to a specific network configuration.

18 Claims, 5 Drawing Sheets

(56) References Cited

U.S. PATENT DOCUMENTS

| | | | | |
|---|---|---|---|---|
| 8,022,710 | B2* | 9/2011 | Ivan | G01R 19/16547 324/522 |
| 2002/0186717 | A1* | 12/2002 | Haq | G11C 7/222 370/503 |
| 2014/0062500 | A1* | 3/2014 | Behrends | H02S 50/10 324/537 |
| 2015/0324265 | A1* | 11/2015 | Nelson | G06F 11/263 714/43 |
| 2018/0231595 | A1 | 8/2018 | Wangemann et al. | |
| 2020/0064387 | A1 | 2/2020 | Hulsen et al. | |
| 2020/0103922 | A1* | 4/2020 | Nonami | G05D 1/0072 |
| 2020/0212676 | A1* | 7/2020 | Dehghanian | H02J 3/242 |
| 2020/0292608 | A1* | 9/2020 | Yan | G06N 3/0445 |
| 2022/0058097 | A1* | 2/2022 | Bautista | G06F 11/2268 |
| 2022/0271834 | A1* | 8/2022 | Castro | H04B 10/0775 |

FOREIGN PATENT DOCUMENTS

| | | | | |
|---|---|---|---|---|
| CN | 111277221 | A * | 6/2020 | H02S 50/10 |
| CN | 113255546 | A | 8/2021 | |
| JP | H063975 | B2 * | 1/1994 | |
| JP | 2004198308 | A * | 7/2004 | |
| WO | WO-2014117279 | A1 * | 8/2014 | G01R 31/343 |
| WO | 2020074128 | A1 | 4/2020 | |

OTHER PUBLICATIONS

European Search Report for Application No. 22190814.8, dated Feb. 2, 2023, 8 pages.

Machine Translation of CN113255546A, Published: Aug. 13, 2021, 21 pages.

Banwell, Thomas, et al. "A Novel Approach to the Modeling of the Indoor Power Line Channel Part I: Circuit Analysis and Companion Model." IEEE Transactions on Power Delivery, vol. 20, No. 2, Apr. 2005: 655-663.

Barmada, S., et al. "Innovative Model for Time-Varying Power Line Communication Channel Response Evaluation." IEEE Journal on Selected Areas in Communications, vol. 24, No. 7, Jul. 2006: 1317-1326.

Ma, X., et al. "Interpretation of Wavelet Analysis and Its Application in Partial Discharge Detection." IEEE Transactions on Dielectrics and Electrical Insulation vol. 9, No. 3, Jun. 2002: 446-457.

Meng, H., et al. "Modeling of Transfer Characteristics for the Broadband Power Line Communication Channel." IEEE Transactions on Power Delivery vol. 19, No. 3, Jul. 2004: 1057-1064.

P. Kshirsagar, et al., "Anatomy of a 20 MW Electrified Aircraft: Metrics and Technology Drivers", AIAA Propulsion and Energy Forum, Aug. 24-28, 2020, Virtual Event, AIAA Propulsion and Energy 2020 Forum, 9 pages.

Sebastian Feike, "Multiple Time Series Classification by Using Continuous Wavelet Transformation", Towards Data Science, 2020, 23, pages.

Thomas, Jeffy, et al. "DC Arc Fault Detection Methods in MEA Distribution Systems." In Aerospace Systems and Technology Conference, pp. 1-11. 2018.

Van Veen, L. W. "Comparison of measurement methods for partial discharge measurement in power cables." Intelligent Electrical Power Grids (Apr. 2014), 116 pages.

* cited by examiner

ONLINE HEALTH MONITORING AND FAULT DETECTION FOR HIGH VOLTAGE DC DISTRIBUTION NETWORKS

BACKGROUND

The present invention generally relates to health monitoring and fault detection and, more specifically, to online health monitoring and fault detection for high voltage DC distribution networks.

Aircraft require electrical power to operate many parts of the aircraft system, including on-board flight control systems, lighting, air conditioning etc. The current and future generations of aircraft use more and more electrical control in place of convention hydraulic, pneumatic etc. control. Such more electric aircraft (MEA) have advantages in terms of the size and weight of the controls and power systems as well as in terms of maintenance and reliability.

Most current large commercial aircraft use electricity, on-board, in the form of an alternating (AC) fixed frequency and/or variable frequency network. Steps have been made to move from 115 V AC to 230 V AC and more recent developments have allowed power supplies to supply high voltage direct current (HVDC) e.g. 270 V DC or more, providing improvements in terms of additional functionality, power supply simplification, weight savings and, thus, fuel efficiency. These HVDC networks can be particularly susceptible to faults. Fault detection within these HVDC networks is of particular interest due to the potential for damage to the sensitive components aboard aircraft. There exists a need for quickly determining faults in these networks.

BRIEF DESCRIPTION

Embodiments of the present invention are directed to a system. A non-limiting example of the system includes a first power supply coupled to a power channel, a load coupled to the power channel, a transmitting sensor coupled to the power channel between the first power supply and the load, a receiving sensor coupled to the power channel between the transmitting sensor and the load, a controller in electronic communication with the transmitting sensor and the receiving sensor, the controller configured to operate the transmitting sensor to provide an alternating current (AC) test signal to the power channel, wherein the AC test signal comprises a predefined test signal pattern, operate the receiving sensor to sense, from the power channel, a continuous power signal including the AC test signal, analyze the AC test signal to determine a fault of the power channel based on comparing the predefined test signal pattern with a predefined nominal probe signal pattern corresponding to a specific network configuration.

In addition to one or more of the features described above, or as an alternative, further embodiments of the system may include that the AC test signal to determine a fault of the power channel based on comparing the predefined test signal pattern with a predefined nominal probe signal pattern corresponding to a specific network configuration comprises transforming, using a continuous wavelet transform, the continuous power signal to a first scalogram, generating, using a machine learning model, a first feature vector comprising a plurality of features extracted from the first scalogram, and plotting the first feature vector in a feature space to determine the fault in the power channel.

In addition to one or more of the features described above, or as an alternative, further embodiments of the system may include that the feature space comprises a first set of feature vectors indicating a normal operation of the power channel based on the predefined test signal pattern.

In addition to one or more of the features described above, or as an alternative, further embodiments of the system may include that determining the fault in the power channel comprises determining a distance value between the first feature vector and the first set of feature vectors indicating the normal operation of the power channel determining the fault in the power channel based on the distance value exceeding a pre-defined threshold value.

In addition to one or more of the features described above, or as an alternative, further embodiments of the system may include that the feature space comprise a second set of feature vectors indicating a first fault type of the power channel.

In addition to one or more of the features described above, or as an alternative, further embodiments of the system may include that the controller is further configured to determine a second distance value between the first feature vector and the second set of feature vectors indicating the first fault type of the power channel, and determining the first fault type based on the second distance value being within a second pre-defined threshold value.

In addition to one or more of the features described above, or as an alternative, further embodiments of the system may include that the feature space is generated using labeled training data for the predefined test signal pattern.

In addition to one or more of the features described above, or as an alternative, further embodiments of the system may include that the feature space is generated based on unlabeled training data comprising historical data for the continuous power signal and the predefined test signal pattern.

In addition to one or more of the features described above, or as an alternative, further embodiments of the system may include a second load coupled to the power channel and a second receiving sensor coupled to the power channel between the transmitting sensor and the second load, wherein the controller is in electronic communication with the second receiving sensor.

In addition to one or more of the features described above, or as an alternative, further embodiments of the system may include that the controller is further configured to operate the second receiving sensor to sense, from the power channel, the continuous power signal and analyze the continuous power signal to determine the fault in the power channel based on comparing the continuous power signal to the predefined signal pattern.

In addition to one or more of the features described above, or as an alternative, further embodiments of the system may include that the first power supply comprises a direct current (DC) power supply, wherein the DC power supply comprises an AC generator and rectification circuit.

In addition to one or more of the features described above, or as an alternative, further embodiments of the system may include that the load comprises an AC motor in an aircraft.

Embodiments of the present invention are directed to a method. A non-limiting example of the method includes providing a first power supply coupled to a power channel, providing a load coupled to the power channel, providing a transmitting sensor coupled to the power channel between the first power supply and the load, providing a receiving sensor coupled to the power channel between the transmitting sensor and the load, operating, by a controller, the transmitting sensor to provide an alternating current (AC) test signal to the power channel, wherein the AC test signal comprises a predefined test signal pattern, operating, by the controller, the receiving sensor to sense, from the power channel, a continuous power signal including the AC test signal, analyzing, by the controller, the AC test signal to determine a fault of the power channel based on comparing the predefined test signal pattern with a predefined nominal probe signal pattern corresponding to a specific network configuration.

In addition to one or more of the features described above, or as an alternative, further embodiments of the method may include that analyzing the AC test signal to determine a fault of the power channel based on comparing the predefined test signal pattern with a predefined nominal probe signal pattern corresponding to a specific network configuration comprises transforming, using a continuous wavelet transform, the continuous power signal to a first scalogram, generating, using a machine learning model, a first feature vector comprising a plurality of features extracted from the first scalogram, and plotting the first feature vector in a feature space to determine the fault in the power channel.

In addition to one or more of the features described above, or as an alternative, further embodiments of the method may include that the feature space comprises a first set of feature vectors indicating a normal operation of the power channel based on the predefined test signal pattern.

In addition to one or more of the features described above, or as an alternative, further embodiments of the method may include that determining the fault in the power channel comprises determining a distance value between the first feature vector and the first set of feature vectors indicating the normal operation of the power channel determining the fault in the power channel based on the distance value exceeding a pre-defined threshold value.

In addition to one or more of the features described above, or as an alternative, further embodiments of the method may include that the feature space comprise a second set of feature vectors indicating a first fault type of the power channel.

In addition to one or more of the features described above, or as an alternative, further embodiments of the method may include determining a second distance value between the first feature vector and the second set of feature vectors indicating the first fault type of the power channel, and determining the first fault type based on the second distance value being within a second pre-defined threshold value.

In addition to one or more of the features described above, or as an alternative, further embodiments of the method may include that the feature space is generated using labeled training data for the predefined test signal pattern.

In addition to one or more of the features described above, or as an alternative, further embodiments of the method may include that the feature space is generated based on unlabeled training data comprising historical data for the continuous power signal and the predefined test signal pattern.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

A detailed description of one or more embodiments of the disclosed apparatus and method are presented herein by way of exemplification and not limitation with reference to the Figures.

Figure 1:
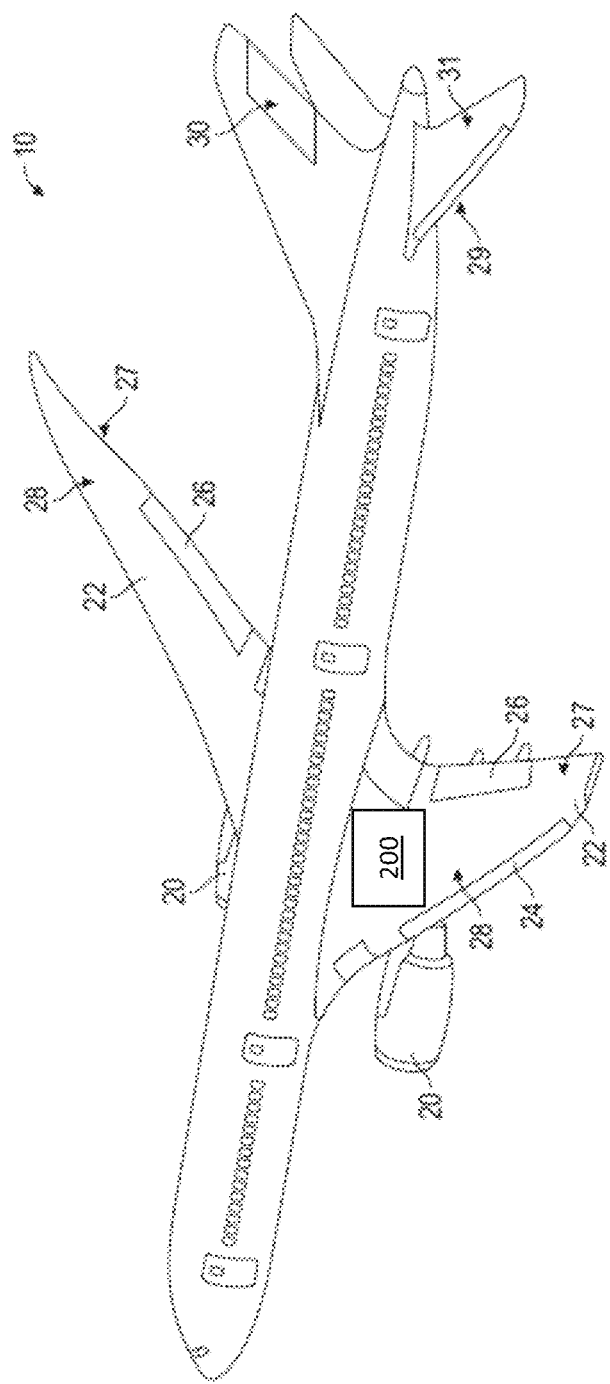
FIG. 1 is a perspective view of an aircraft that may incorporate embodiments of the present disclosure.

FIG. 1 illustrates an example of a commercial aircraft 10 having aircraft engines 20 the engine or the aircraft has the invention? that may embody aspects of the teachings of this disclosure. The aircraft 10 includes two wings 22 that each include one or more slats 24 and one or more flaps 26. The aircraft further includes ailerons 27, spoilers 28, horizontal stabilizer trim tabs 29, rudder 30 and horizontal stabilizer 31. The term "control surface" used herein includes but is not limited to either a slat or a flap or any of the above described. The aircraft 10 also includes one or more DC distribution networks 200 (described in greater detail in FIG. 2) which includes high frequency sensors for determine faults and for health management.

Turning now to an overview of technologies that are more specifically relevant to aspects of the disclosure, electrical component power inside aircrafts is projected to increate to over 10 megawatts within the next decade. This increase will require high voltage direct current (HVDC) distribution networks for both propulsion and energy storage systems within the aircraft. Next generation HVDC distribution networks are expected to operate between 3 to 5 kV to optimally balance both transmission power and weight requirements of the distribution network elements. Along with these new HVDC distribution network in an aircraft environments comes a higher probability of electrical faults. Some particularly difficult to detect fault types include partial discharge faults, series arc faults, and parallel arc faults. The partial discharge faults can cause damage to insulation over time due to the high altitude and lower pressure aircraft environments. The series arc faults can be caused by corrosion to series connectors and/or loose connections in series with electrical loads. Further, series arc faults can increase power loss and cause additional heating to occur over time. The parallel arc faults occur when there is electrical arcing between two line conductors or between a line conductor and ground. These parallel arc faults can cause immediate power loss.

Series arc-faults and partial discharge related degradation are often difficult to detect in an HVDC distribution network. To address this difficulty in detecting these faults, one or more embodiments provide for the inclusion of high frequency (HF) sensors to be attached to the power channels in the HVDC distribution network of an aircraft. These HF sensors include radio frequency (RF) transmitters/receivers (transceivers) and impedance matching networks. In one or more embodiments, the HF sensors also include a controller for controlling any of the components of the sensor and/or for signal processing. In one or more embodiments, a controller can be separate from the HF sensors and in electronic communication with the HF sensors. In one or more embodiments, the HF sensors are configured to inject high frequency alternating current (AC) voltage test signals in a specific pattern into the DC distribution network. Additional HF sensors can be configured to receive these injected test signals for signal processing and analysis. The data captured by the HF sensors is analyzed using wavelet transformation. Further, with continuous monitoring and time series classification using continuous time wavelet transformations, a profile of the DC distribution network can be created during normal operation. Or, in some embodiments, a normal operation profile can be created for a DC distribution network offline.

In one or more embodiments, the normal operation profile can be utilized by the HF sensors to determine faults in the DC distribution network. As an HF sensor injects the test AC signal into the distribution networks, the receiving HF sensors can receive this test AC signal and compare the test signal to the normal operation profile to determine an existence of a fault and further determine a type of fault in the DC distribution network. The HF sensors, including control circuitry (controllers), can implement machine learning models and/or neural network technology to compare data/signals from the HF sensor sending the test AC signal with a normal operation profile of the DC distribution network. Further, the machine learning models and/or neural networks can implement clustering algorithms for the data/signals to determine a type of fault in the DC distribution network. In other embodiments, the data/signal processing described above can be performed local to the HF sensors or the data can be transferred to a higher level control circuitry for signal processing as described above.

Figure 2:
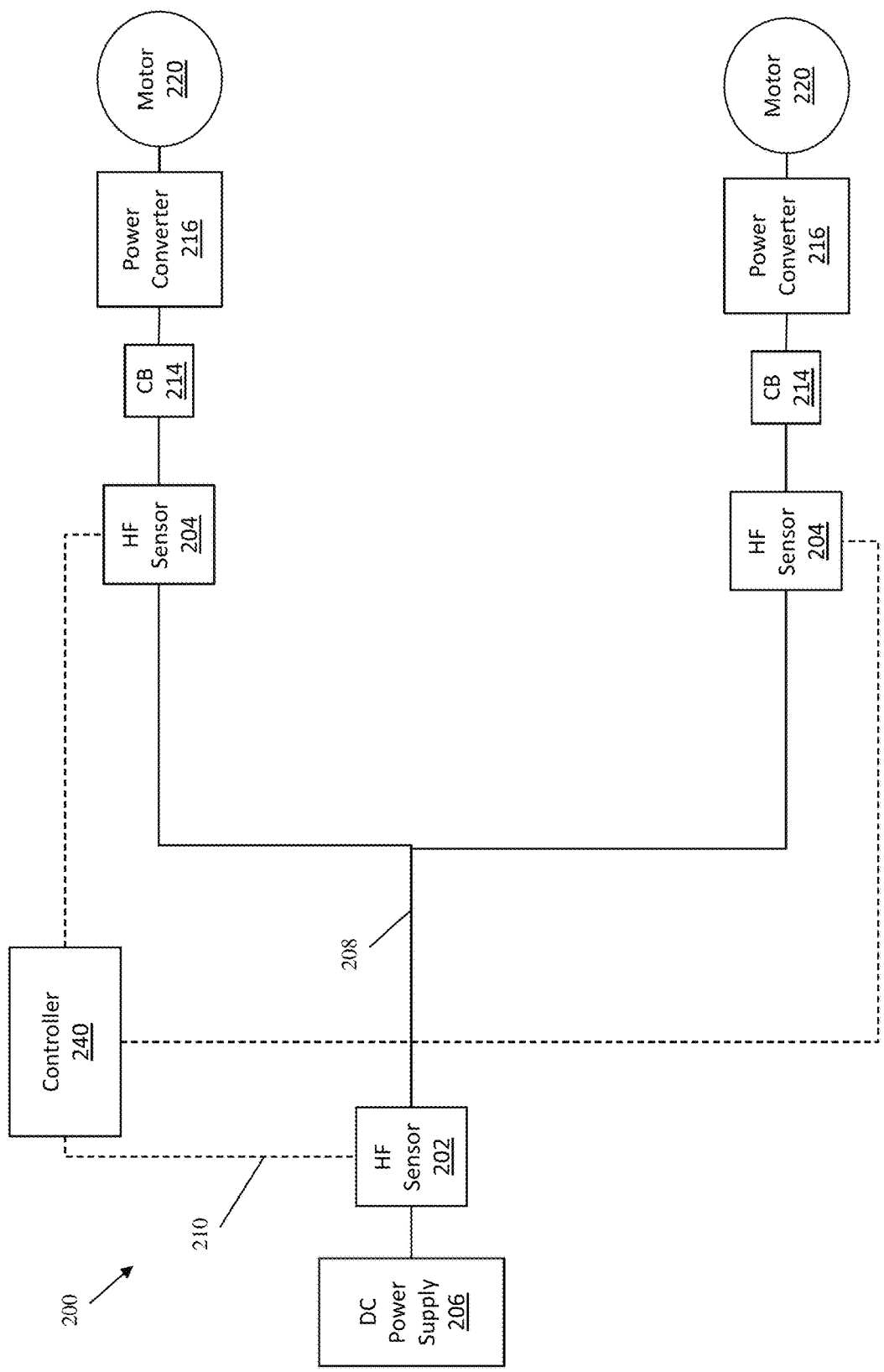
FIG. 2 depicts a block diagram DC distribution network including HF sensors according to one or more embodiments.

FIG. 2 depicts a block diagram DC distribution network including HF sensors according to one or more embodiments. The DC distribution network 200 can, for example, be implemented in an aircraft environment similar to the aircraft 10 described in FIG. 1. Further, the DC distribution network 200 includes a DC power supply 206 which supplies DC power in the DC distribution network 200 to one or more motors 220. While only one DC power supply 206 and two motors 220 are shown in the illustrated example, any number of DC power supplies and motors can be utilized herein. In one or more embodiments, the DC power supply 206 includes an AC generator, a protection device, and an AC to DC power converter (rectifier) (not shown). The AC generator can be any type of generator such as a generator that receives mechanical input from an engine of an aircraft, for example. The protection device can be any type of circuit breaker attached between the AC generator and the rectifier. The rectifier provides high voltage rectified DC power to the power channel 208 (sometimes referred to as a DC bus) of the DC distribution network 200. Attached to this power channel 208 are motors 220 coupled to a power converter 216. The power converter 216 can be a DC to AC power converter (inverter) that converts the DC power supplied to the power channel 208 to AC power to drive the AC motors 220. A protection device 214 is coupled to the power channel 208 before the power converter 216 to provide protection to the AC motors 220. The DC power supply 206 can be a high voltage DC source. Also, the power converter 216 and motors 220 can be a high voltage DC load on the network 200. The CB 214 is a high voltage DC protection device.

In one or more embodiments, the DC distribution network 200 includes high frequency (HF) sensors 202, 204. The HF sensors 202, 204 are coupled to the power channel 208 at different locations in the DC distribution network 200. A transmitting HF sensor 202 is located at the output of the DC power supply 206 and receiving HF sensors 204 are located at the motors 220 in the distribution network 200. The HF sensors 202, 204 each include components configured to both transmit and receive signal data (i.e., sensed voltages/current) from the power channel 208. The HF sensors 202, 204 also include control circuitry and at least one memory and/or storage. Further, the HF sensors 202, 204 include components that can be either passive (combinations of L,C,R) or active operational amplifier components to match the input impedance of the sensor nodes to the impedance of the high voltage DC distribution network. In one or more embodiments, the control circuitry in the HF sensors 202, 204 can communicate with a controller 240 in electronical communication with the HF sensors 202, 204 through a communication channel 210. Or, in some embodiments, the HF sensors 202, 204 can communicate with each other through communication channel 210.

In one or more embodiments, the HF sensors 202, 204 coupled to the power channel 208 can be utilized to test the DC distribution network 200 for potential faults as described above. The transmitting HF sensor 202, attached near the output of the DC power supply 206, can inject a high frequency AC voltage test signal in a specified pattern into the power channel 208. In one or more embodiments, the DC power supply is a high voltage DC power supply. The high voltage DC distribution network acts an RF communication channel in addition to transmitting power from DC sources to loads. A set of receiving HF sensors 204 can be placed at strategic locations in this power network 200 and are configured to receive the high frequency AC test signal from the power channel 208. The receiving HF sensors 204 which include controllers/control circuitry can filter the test signal pattern from the ambient electromagnetic noise generated by sources and loads present in the DC distribution network 200 and process this test signal pattern. The receiving HF sensors 204 can have multiple test signal patterns that indicate normal operation of the distribution network for different operating conditions and different network configurations. The HF sensor 204 control circuitry can process the received test signal patterns and compare them to the one or more test signals patterns stored in memory indicative of normal operations to determine whether there is a fault or other issue in the distribution network 200. In one or more embodiments, the controller 240 can perform this comparison step with the HF sensors 204 transmitting the signal pattern data to the controller 240 for processing and comparison.

In one or more embodiments, the one or more test signal patterns that indicate normal operation of the DC distribution network 200 can be created offline using initial configuration conditions of the network 200. These test signal patterns for normal operation can be created using circuit simulations, circuit testing software, actual component testing, and/or any other test signal pattern generation techniques. The one or more test signal patterns can be stored as a normal operation profile for the network 200 in the HF sensors 202, 204. During operation of the distribution network 200, the transmitting HF sensor 202 provides the high frequency AC test signal to the power channel 208 which is received by each receiving HF sensors 204. The received test signal is compared to the normal operation profile for determination of detected faults. As each motor 220 includes a receiving HF sensor 204, the location of any detected faults can be further discerned based on a first receiving HF sensor determining a fault and a second receiving HF sensor not determining a fault. In this scenario, the fault would be located on a branching of the power channel 208 that is connected to the HF sensor determining the fault.

Figure 3:
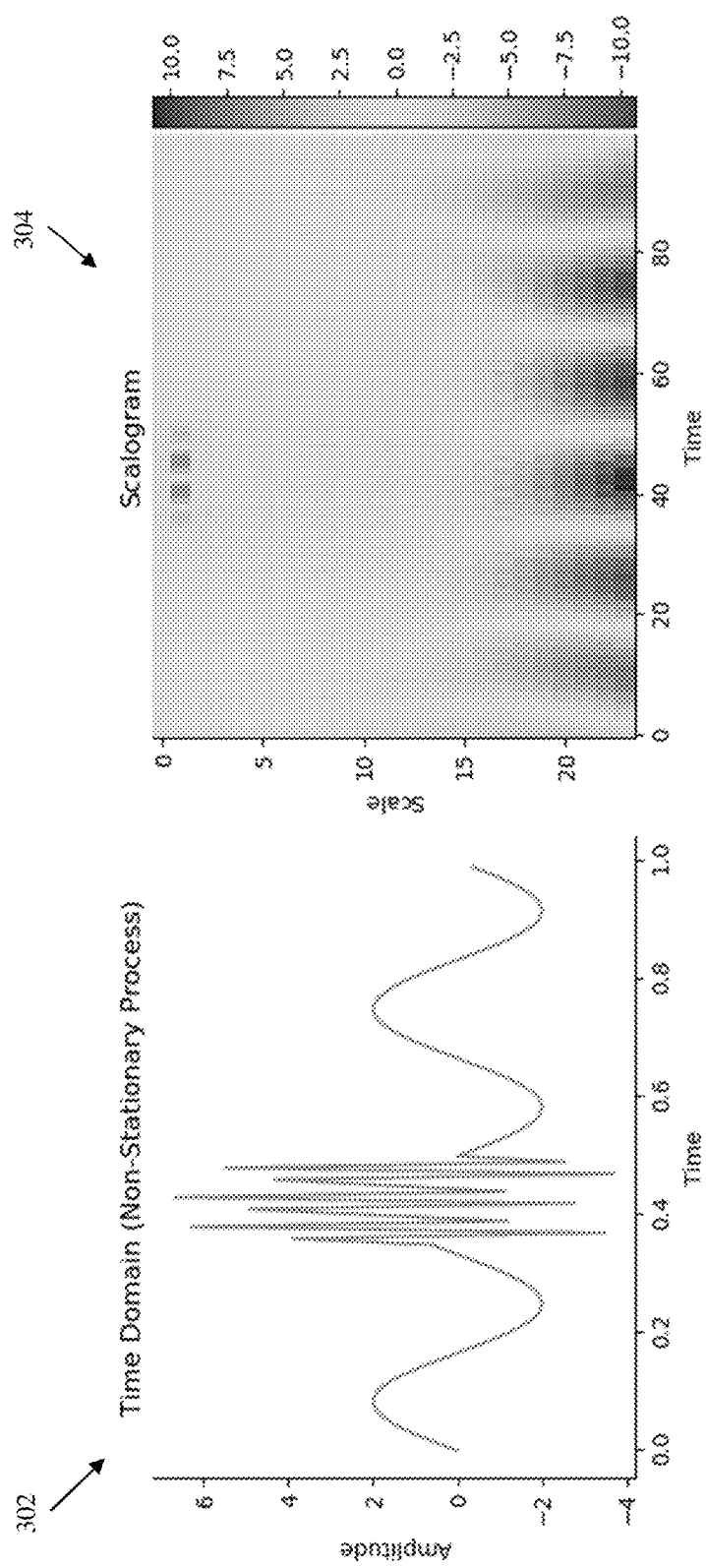
FIG. 3 depicts two graphs illustrating a continuous wavelet transformation from a time domain graph to a scalogram according to one or more embodiments.

In one or more embodiments, the determination of a fault in the DC distribution network 200 can be performed utilizing one or more machine learning models and/or neural networks. In one or more embodiments, classification and/or clustering can be utilized for comparing the AC test signal patterns to normal operation patterns when determining a fault in the network 200. Classification and clustering can be suitable for pattern recognition problems such as the fault detection using AC test signal patterns described herein. The AC test signal patterns injected into the DC power channel 208 are received by the receiving HF sensors 204 as a time domain signal. In one or more embodiments, the HF sensors 204 control circuitry can analyze the AC test signals using continuous wavelet transformations. FIG. 3 depicts two graphs illustrating a continuous wavelet transformation from a time domain graph to a scalogram according to one or more embodiments. The first graph 302 depicts the time domain signal being sensed/detected by the receiving HF sensor 204. The HF sensors 204 control circuitry and/or controller 240 can transform the time domain signal into a scalogram as depicted in the second graph 304 using continuous wavelet transforms. A continuous wavelet transform decomposes a signal using wavelets, which are generally highly localized in time. The continuous wavelet transform may provide a higher resolution relative to discrete transforms, thus providing the ability to garner more information from signals than typical frequency transforms such as Fourier transforms (or any other spectral techniques) or discrete wavelet transforms. Continuous wavelet transforms allow for the use of a range of wavelets with scales spanning the scales of interest of a signal such that small scale signal components correlate well with the smaller scale wavelets and thus manifest at high energies at smaller scales in the transform. Likewise, large scale signal components correlate well with the larger scale wavelets and thus manifest at high energies at larger scales in the transform. Thus, components at different scales may be separated and extracted in the wavelet transform domain. Moreover, the use of a continuous range of wavelets in scale and time position allows for a higher resolution transform than is possible relative to discrete techniques.

In one or more embodiments, the scalogram 304 can be created from the received signal data sensed/detected by the receiving HF sensors 204 and compared to a scalogram of a normal operation signal pattern using image recognition, classification, and/or clustering techniques (referred to collectively as "machine learning techniques"). In one or more embodiments, the scalogram is not the sole processing technique, other signal processing techniques for one-dimensional time varying functions can also be used. The advantage of CWT is that the resulting two dimensional matrix can be easily processed by optimized neural network techniques. The HF sensor 204 control circuitry and/or controller 240 can create feature vectors of the scalogram, for example, which include multiple feature values extracted from characteristics of the scalogram. These feature vectors can be plotted in a multidimensional feature space and compared to other plotted feature vectors in the multidimensional feature space to determine that a fault exists. The multidimensional feature space can be pre-populated with feature vectors that have been labeled with labels such as normal operation, partial discharge fault, series arc fault, and parallel arc fault, for example. The proximity of the feature vector taking from a scalogram for an AC test signal can dictate the overall health of the distribution network 200. For example, if the feature vectors from test signals are within a threshold proximity in the feature space to the feature vectors for normal operation, then the distribution network 200 can be performing as anticipated. However, if the test signal feature vectors are more proximate to faults or outside a threshold for normal operation, then this would indicate a potential issue with the network 200. As mentioned above, the training of the feature space can be done offline using labeled training data where predefined signal patterns are injected in a DC distribution network with anticipated scalograms being generated and feature vectors are labeled as normal operation or as different fault types depending on the training and labels. For example, for a series arc fault, a simulation could dictate what the predefined test signal would look like at the receiving sensor 204 and a resultant signal transformed to a scalogram could be used for training the machine learning model (i.e., feature space). When in operation, the feature space includes sets of feature vectors pre-plotted indicating the normal operation and other sets of feature vectors indicating faults and fault types. When the real-time signal data is being sensed by the sensors 204, features are extracted from the data to be plotted and compared to the labeled vectors to make determinations as to faults and fault types or if the network is operating in normal operations.

In one or more embodiments, the feature space (machine learning model) can be trained using unlabeled training data. This unlabeled training data can include historical operation data of the network 200 which is received by the HF sensors 204 and clustered and plotted in the feature space. The historical operation data would include the pre-defined test signals being injected into the power channel 208.

The control circuitry and/or controller 240 or any of the hardware referenced in the system 200 can be implemented by executable instructions and/or circuitry such as a processing circuit and memory. The processing circuit can be embodied in any type of central processing unit (CPU), including a microprocessor, a digital signal processor (DSP), a microcontroller, an application specific integrated circuit (ASIC), a field programmable gate array (FPGA), or the like. Also, in embodiments, the memory may include random access memory (RAM), read only memory (ROM), or other electronic, optical, magnetic, or any other computer readable medium onto which is stored data and algorithms as executable instructions in a non-transitory form In one or more embodiments, the control circuitry and/or controller 240 can execute machine readable instructions to implement so-called engines/classifiers. In one or more embodiments of the invention, the features of the various engines/classifiers described herein can be implemented as described above, or can be implemented on a neural network (not shown). In one or more embodiments, the features of the engines/classifiers can be implemented by configuring and arranging the control circuitry and/or controller 240 to execute machine learning (ML) algorithms. In general, ML algorithms, in effect, extract features from received data (e.g., the test signal patterns, etc.) in order to "classify" the received data. Examples of suitable classifiers include but are not limited to neural networks (described in greater detail below), support vector machines (SVMs), logistic regression, decision trees, hidden Markov Models (HMMs), etc. The end result of the classifier's operations, i.e., the "classification," is to predict a class for the data. The ML algorithms apply machine learning techniques to the received data in order to, over time, create/train/update a unique "model." The learning or training performed by the engines/classifiers can be supervised, unsupervised, or a hybrid that includes aspects of supervised and unsupervised learning. Supervised learning is when training data is already available and classified/labeled. Unsupervised learning is when training data is not classified/labeled so must be developed through iterations of the classifier. Unsupervised learning can utilize additional learning/training methods including, for example, clustering, anomaly detection, neural networks, deep learning, and the like. In one or more embodiments where the engines/classifiers are implemented as neural networks, a resistive switching device (RSD) can be used as a connection (synapse) between a pre-neuron and a post-neuron, thus representing the connection weight in the form of device resistance. Neuromorphic systems are interconnected processor elements that act as simulated "neurons" and exchange "messages" between each other in the form of electronic signals. Similar to the so-called "plasticity" of synaptic neurotransmitter connections that carry messages between biological neurons, the connections in neuromorphic systems such as neural networks carry electronic messages between simulated neurons, which are provided with numeric weights that correspond to the strength or weakness of a given connection. The weights can be adjusted and tuned based on experience, making neuromorphic systems adaptive to inputs and capable of learning. For example, a neuromorphic/neural network for handwriting recognition is defined by a set of input neurons, which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. Thus, the activated output neuron determines (or "learns") which character was read. Multiple pre-neurons and post-neurons can be connected through an array of RSD, which naturally expresses a fully-connected neural network.

Figure 4:
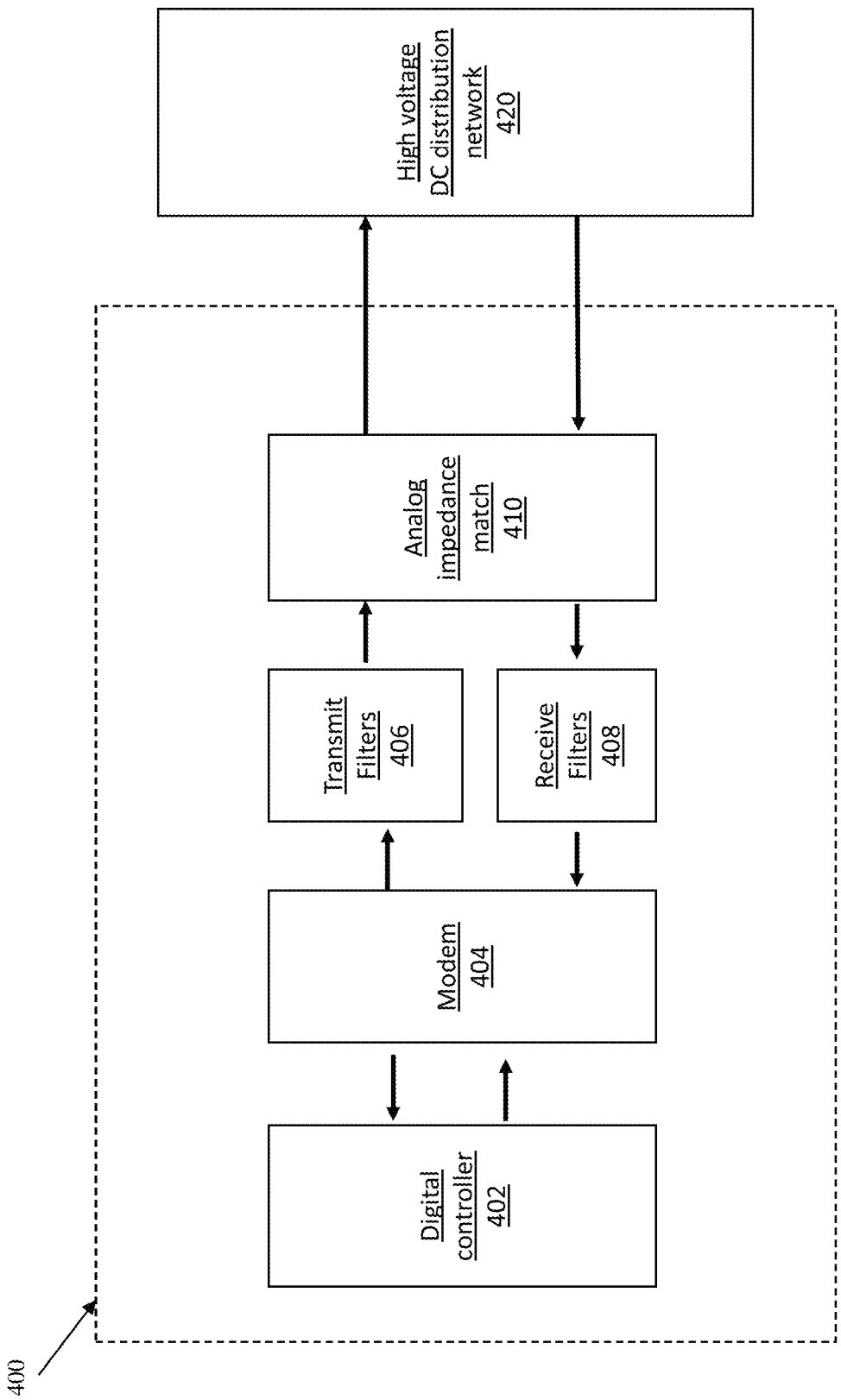
FIG. 4 depicts a block diagram of an exemplary HF sensor according to one or more embodiments.

FIG. 4 depicts a block diagram of an exemplary HF sensor according to one or more embodiments. The HF sensor 400 includes a digital controller 402 in electronic communication with a modem 404. The controller 402 can provide a test signal for the high voltage DC distribution network 420. The signal is provided through one or more transmit filters 406 and an analog impedance match network 410 to the high voltage DC distribution network 420. Any signals from the HVDC network 420 can be received by the controller 402 through the analog impedance match 410 and one or more receive filters 408.

Figure 5:
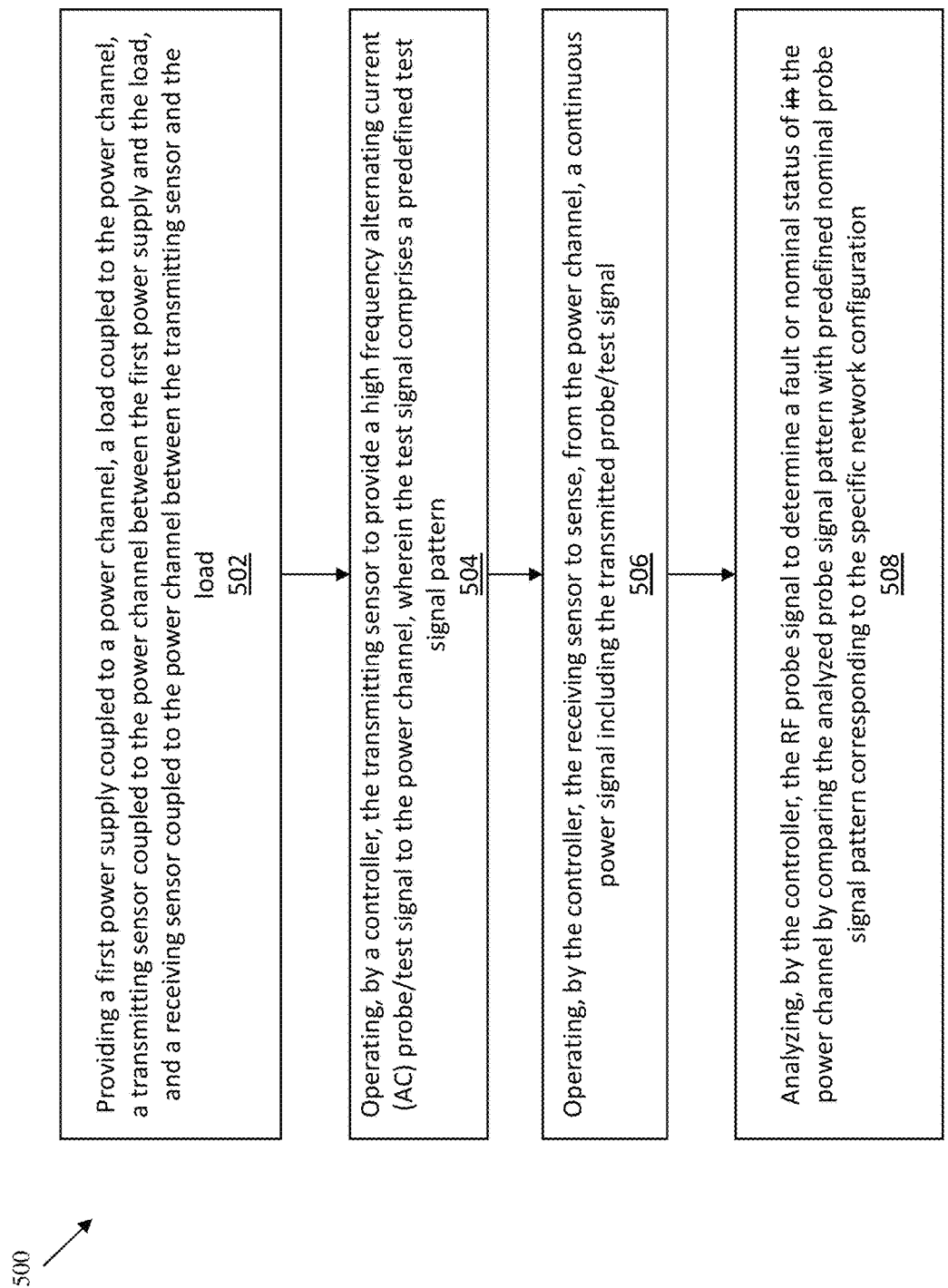
FIG. 5 depicts a flow diagram of a method for health monitoring and fault detection in power distribution networks according to one or more embodiments.

FIG. 5 depicts a flow diagram of a method for health monitoring and fault detection in power distribution networks according to one or more embodiments. The method 500 includes providing a first power supply coupled to a power channel, a load coupled to the power channel, a transmitting sensor coupled to the power channel between the first power supply and the load, and a receiving sensor coupled to the power channel between the transmitting sensor and the load, as shown in block 502. The transmitting sensors and receiving sensors include transceivers and control circuitry. At block 504, the method 500 includes operating, by a controller, the transmitting sensor to provide an alternating current (AC) test signal to the power channel, wherein the AC test signal comprises a predefined test signal pattern. Then, at block 506, the method 500 includes operating, by the controller, the receiving sensor to sense, from the power channel, a continuous power signal including the AC test signal. And at block 508, the method 500 includes analyzing, by the controller, the AC test signal to determine a fault of the power channel based on comparing the predefined test signal pattern with a predefined nominal probe signal pattern corresponding to a specific network configuration.

Additional processes may also be included. It should be understood that the processes depicted in FIG. 5 represent illustrations, and that other processes may be added or existing processes may be removed, modified, or rearranged without departing from the scope and spirit of the present disclosure.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system comprising:
   a first power supply coupled to a power channel;
   a load coupled to the power channel;
   a transmitting sensor coupled to the power channel between the first power supply and the load;
   a receiving sensor coupled to the power channel between the transmitting sensor and the load;
   a controller in electronic communication with the transmitting sensor and the receiving sensor, the controller configured to:
      operate the transmitting sensor to provide an alternating current (AC) test signal to the power channel, wherein the AC test signal comprises a predefined test signal pattern;
      operate the receiving sensor to sense, from the power channel, a continuous power signal including the AC test signal;
      analyze the AC test signal to determine a fault of the power channel based on comparing the predefined test signal pattern with a predefined nominal probe signal pattern corresponding to a specific network configuration;
   wherein the AC test signal to determine a fault of the power channel based on comparing the predefined test signal pattern with a predefined nominal probe signal pattern corresponding to a specific network configuration comprises:
   transforming, using a continuous wavelet transform, the continuous power signal to a first scalogram;
   generating, using a machine learning model, a first feature vector comprising a plurality of features extracted from the first scalogram;
   plotting the first feature vector in a feature space to determine the fault in the power channel.

2. The system of claim 1, wherein the feature space comprises a first set of feature vectors indicating a normal operation of the power channel based on the predefined test signal pattern.

3. The system of claim 2, wherein determining the fault in the power channel comprises:
   determining a distance value between the first feature vector and the first set of feature vectors indicating the normal operation of the power channel;
   determining the fault in the power channel based on the distance value exceeding a pre-defined threshold value.

4. The system of claim 3, wherein the feature space comprise a second set of feature vectors indicating a first fault type of the power channel.

5. The system of claim 4, wherein the controller is further configured to:
   determine a second distance value between the first feature vector and the second set of feature vectors indicating the first fault type of the power channel; and
   determining the first fault type based on the second distance value being within a second pre-defined threshold value.

6. The system of claim 1, wherein the feature space is generated using labeled training data for the predefined test signal pattern.

7. The system of claim 1, wherein the feature space is generated based on unlabeled training data comprising historical data for the continuous power signal and the predefined test signal pattern.

8. The system of claim 1, further comprising:
   a second load coupled to the power channel; and
   a second receiving sensor coupled to the power channel between the transmitting sensor and the second load, wherein the controller is in electronic communication with the second receiving sensor.

9. The system of claim 8, wherein the controller is further configured to:
   operate the second receiving sensor to sense, from the power channel, the continuous power signal; and
   analyze the continuous power signal to determine the fault in the power channel based on comparing the continuous power signal to the predefined signal pattern.

10. The system of claim 1, wherein the first power supply comprises a direct current (DC) power supply, wherein the DC power supply comprises an AC generator and rectification circuit.

11. The system of claim 1, wherein the load comprises an AC motor in an aircraft.

12. A method comprising
    providing a first power supply coupled to a power channel;
    providing a load coupled to the power channel;
    providing a transmitting sensor coupled to the power channel between the first power supply and the load;
    providing a receiving sensor coupled to the power channel between the transmitting sensor and the load;
    operating, by a controller, the transmitting sensor to provide an alternating current (AC) test signal to the power channel, wherein the AC test signal comprises a predefined test signal pattern;
    operating, by the controller, the receiving sensor to sense, from the power channel, a continuous power signal including the AC test signal;
    analyzing, by the controller, the AC test signal to determine a fault of the power channel based on comparing the predefined test signal pattern with a predefined nominal probe signal pattern corresponding to a specific network configuration;

wherein analyzing the AC test signal to determine the fault in the power channel based on comparing the predefined test signal pattern with a predefined nominal probe signal pattern corresponding to a specific network configuration comprises:

transforming, using a continuous wavelet transform, the continuous power signal pattern to a first scalogram;

generating, using a machine learning model, a first feature vector comprising a plurality of features extracted from the first scalogram;

plotting the first feature vector in a feature space to determine the fault in the power channel.

13. The method of claim 12, wherein the feature space comprises a first set of feature vectors indicating a normal operation of the power channel based on the predefined test signal pattern.

14. The method of claim 13, wherein determining the fault in the power channel comprises:

determining a distance value between the first feature vector and the first set of feature vectors indicating the normal operation of the power channel;

determining the fault in the power channel based on the distance value exceeding a pre-defined threshold value.

15. The method of claim 14, wherein the feature space comprise a second set of feature vectors indicating a first fault type of the power channel.

16. The method of claim 15, further comprising:

determining a second distance value between the first feature vector and the second set of feature vectors indicating the first fault type of the power channel; and determining the first fault type based on the second distance value being within a second pre-defined threshold value.

17. The method of claim 12, wherein the feature space is generated using labeled training data for the predefined test signal pattern.

18. The method of claim 12, wherein the feature space is generated based on unlabeled training data comprising historical data for the continuous power signal and the predefined test signal pattern.

* * * * *